United States Patent
Kim et al.

(10) Patent No.: US 11,665,941 B2
(45) Date of Patent: May 30, 2023

(54) METHOD OF COMPENSATING FOR DEGRADATION OF DISPLAY DEVICE

(71) Applicant: SAMSUNG DISPLAY CO., LTD., Yongin-si (KR)

(72) Inventors: Kyung Man Kim, Yongin-si (KR); Seok Gyu Ban, Yongin-si (KR); Sang Jae Yeo, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/573,091

(22) Filed: Jan. 11, 2022

(65) Prior Publication Data

US 2022/0130942 A1  Apr. 28, 2022

Related U.S. Application Data

(62) Division of application No. 16/820,867, filed on Mar. 17, 2020, now Pat. No. 11,264,445.

(30) Foreign Application Priority Data

Jul. 23, 2019  (KR) .................. 10-2019-0089098

(51) Int. Cl.
*G09G 3/3233* (2016.01)
*G09G 3/3208* (2016.01)
(Continued)

(52) U.S. Cl.
CPC ......... *H01L 27/3276* (2013.01); *G09G 3/325* (2013.01); *G09G 3/3208* (2013.01);
(Continued)

(58) Field of Classification Search
CPC .............. G09G 3/3233; G09G 3/3291; G09G 3/3275; G09G 3/3208; G09G 3/3225; G09G 2300/0819; G09G 2300/0861; G09G 2300/0842; G09G 2320/045; G09G 2320/043; G09G 2320/0295; G09G 2320/0233; G09G 2320/02; G09G 2320/0242; G09G 3/3258; G09G 3/3266;
(Continued)

(56) References Cited

U.S. PATENT DOCUMENTS

| | | | |
|---|---|---|---|
| 7,864,172 B2 | 1/2011 | Miyake et al. | |
| 9,105,236 B2 | 8/2015 | Shim et al. | |
| 9,125,278 B2 | 9/2015 | Nathan et al. | |
| 9,384,696 B2 | 7/2016 | Okuno et al. | |
| 9,449,560 B2 * | 9/2016 | Oh ..................... | G09G 3/3283 |
| 9,478,159 B2 | 10/2016 | Choi | |

(Continued)

FOREIGN PATENT DOCUMENTS

KR    1020080105997 A    12/2008

*Primary Examiner* — Dismery Mercedes
(74) *Attorney, Agent, or Firm* — Cantor Colburn LLP

(57) ABSTRACT

A method of compensating for degradation of a display device includes sensing a first sensing current flowing through a sensing line connected to a pixel, which includes a programming period for writing a data voltage of a predetermined color to a storage capacitor of the pixel, sensing a sensing voltage of the sensing line, which includes a period for charging a line capacitor connected to the sensing line, estimating a voltage of an anode electrode of an organic light emitting diode using a second sensing current estimated from the first sensing current and the sensing voltage, and determining a degradation compensation value using the voltage of the anode electrode.

2 Claims, 11 Drawing Sheets

(51) Int. Cl.
  *G09G 3/3283* (2016.01)
  *G09G 3/3266* (2016.01)
  *G09G 3/3258* (2016.01)
  *G09G 3/3291* (2016.01)
  *H01L 27/32* (2006.01)
  *G09G 3/325* (2016.01)

(52) U.S. Cl.
  CPC ......... *G09G 3/3233* (2013.01); *G09G 3/3258* (2013.01); *G09G 3/3266* (2013.01); *G09G 3/3283* (2013.01); *G09G 3/3291* (2013.01); *G09G 2300/0842* (2013.01); *G09G 2320/0233* (2013.01); *G09G 2320/0242* (2013.01); *G09G 2320/0295* (2013.01); *G09G 2320/043* (2013.01); *G09G 2320/045* (2013.01)

(58) Field of Classification Search
  CPC ................. G09G 3/325; G09G 3/3283; G09G 2300/0426; H01L 27/3276; H01L 27/3244; H01L 27/3225; H05B 45/60
  See application file for complete search history.

(56) References Cited

U.S. PATENT DOCUMENTS

| | | | |
|---|---|---|---|
| 9,721,512 B2 | 8/2017 | Soni et al. | |
| 10,062,326 B2* | 8/2018 | Takizawa | G09G 3/3291 |
| 10,325,555 B2 | 6/2019 | Wu et al. | |
| 10,410,584 B2* | 9/2019 | Xie | G09G 3/3233 |
| 10,446,621 B2* | 10/2019 | Kim | G09G 3/3233 |
| 10,460,662 B2 | 10/2019 | Song et al. | |
| 10,861,389 B2* | 12/2020 | Lin | G09G 3/3258 |
| 10,867,554 B2 | 12/2020 | He et al. | |
| 10,964,266 B2 | 3/2021 | Lee | |
| 11,056,065 B2* | 7/2021 | Hwang | G09G 3/3233 |
| 11,094,252 B2 | 8/2021 | Lin et al. | |
| 11,114,028 B2* | 9/2021 | Yoon | G09G 3/3233 |
| 2014/0092144 A1 | 4/2014 | Kim et al. | |
| 2016/0012798 A1* | 1/2016 | Oh | G09G 3/3283 |
| | | | 345/82 |
| 2016/0163265 A1 | 6/2016 | Yang et al. | |
| 2017/0025061 A1* | 1/2017 | Takizawa | G09G 3/3291 |
| 2019/0103055 A1* | 4/2019 | Gao | G09G 3/3233 |
| 2020/0184902 A1 | 6/2020 | Kim | |
| 2020/0193918 A1 | 6/2020 | Hwang et al. | |

* cited by examiner

METHOD OF COMPENSATING FOR DEGRADATION OF DISPLAY DEVICE

This application is a divisional of U.S. patent application Ser. No. 16/820,867, filed on Mar. 17, 2020, which claims priority to Korean Patent Application No. 10-2019-0089098, filed on Jul. 23, 2019, and all the benefits accruing therefrom under 35 U.S.C. § 119, the content of which in its entirety is herein incorporated by reference.

BACKGROUND

1. Field

Exemplary embodiments of the invention relate to a method of compensating for degradation of a display device.

2. Description of the Related Art

An organic light emitting diode ("OLED") display uses an OLED of which luminance is controlled by a current or a voltage and a thin film transistor ("TFT") that drives the OLED. The OLED includes an anode layer and a cathode layer forming an electric field, and an organic light emitting material emitting light by the electric field. The TFT is classified into an amorphous silicon (amorphous-Si) TFT, a low temperature poly-silicon ("LTPS") TFT, and an oxide TFT according to a type of an active layer.

A pixel is degraded by degradation of the OLED and the TFT, and the degradation of the pixel causes a luminance reduction of the pixel. Even when a constant voltage is applied to the pixel, a current flowing through the pixel is reduced due to the degradation of the OLED and the TFT, and thus the luminance of the pixel is reduced.

SUMMARY

In consideration of a degradation of a pixel, a power voltage that provides a driving current of the pixel may be set at a time of shipment of a product, but in this case, a voltage greater than a desired voltage is supplied even before an organic light emitting diode ("OLED") and a thin film transistor ("TFT") are degraded, which increases power consumption of a display device.

A problem to be resolved by the invention is to provide a method of compensating for degradation capable of compensating for degradation of a pixel when a pixel driving current cannot be measured directly.

The problems of the invention are not limited to the above-described problems, and other technical problems that are not described may be clearly understood by those skilled in the art from the following description.

An exemplary embodiment of a method of compensating for degradation of a display device according to the invention which resolves the problem described above includes sensing a first sensing current flowing through a sensing line connected to a pixel, which includes a programming period for writing a data voltage of a predetermined color to a storage capacitor of the pixel, sensing a sensing voltage of the sensing line, which includes a period for charging a line capacitor connected to the sensing line, estimating a voltage of an anode electrode of an organic light emitting diode using a second sensing current estimated from the first sensing current and the sensing voltage, and determining a degradation compensation value using the voltage of the anode electrode.

In an exemplary embodiment, the pixel may include a second transistor including a first terminal connected to a data line to which the data voltage is applied, a second terminal connected to a first node, and a first gate terminal connected to a first scan line to which a first scan signal is applied, a first transistor including a third terminal connected to a first power line to which a first power signal is applied, a fourth terminal connected to a second node, and a second gate terminal connected to the first node, a third transistor including a fifth terminal connected to the sensing line, a sixth terminal connected to the second node, and a third gate terminal connected to a second scan line to which a second scan signal is applied, the storage capacitor including a first electrode connected to the first node and a second electrode connected to the second node, and the organic light emitting diode including the anode electrode connected to the second node and a cathode electrode connected to a second power line to which a second power signal of a level lower than a level of the first power signal is applied.

In an exemplary embodiment, the second transistor may be turned on in response to a logic of the first scan line to write the data voltage to the storage capacitor in the programming period.

In an exemplary embodiment, the data voltage may have a value obtained by adding a value of threshold voltage compensation data of the pixel to a value of a reference voltage of the pixel.

In an exemplary embodiment, after the data voltage is written to the storage capacitor, the third transistor may be turned on in response to a logic of the second scan line to apply an initialization voltage to the second node from the sensing line.

In an exemplary embodiment, the first sensing current may be a current flowing through the sensing line when the second transistor is turned off in response to the logic of the first scan line after the programming period.

In an exemplary embodiment, the voltage of the anode may be a voltage when a current flowing through the first transistor and a current flowing through the organic light emitting diode are balanced.

In an exemplary embodiment, in the sensing the sensing voltage of the sensing line, the second transistor may be turned on and off in response to a logic of the first scan line, and the third transistor may maintain a turn-on state in response to a logic of the second scan line.

In an exemplary embodiment, a voltage charged in the line capacitor may increase.

In an exemplary embodiment, the display device may further include an analog-digital converter which senses the voltage charged in the line capacitor.

In an exemplary embodiment, the sensing the sensing voltage of the sensing line may be for sensing current mobility of the first transistor.

In an exemplary embodiment, the sensing the first sensing current, the sensing the sensing voltage of the sensing line, and the estimating of the voltage of the anode electrode maybe performed before and after degradation.

In an exemplary embodiment, in the determining the degradation compensation value, the degradation compensation value may be determined as a ratio of the voltage value of the anode electrode after the degradation to the voltage value of the anode electrode before the degradation.

In an exemplary embodiment, in the determining the degradation compensation value, the degradation compensation value may be determined through a function calculation reflecting a panel characteristic of the display device to the ratio.

In an exemplary embodiment, the method may further include generating degradation compensation data after the determining the degradation compensation value.

In addition, an exemplary embodiment of a method of compensating for degradation of a display device which resolves the problem described above is provided. The display device includes a pixel. The pixel includes a second transistor including a first terminal connected to a data line to which a data voltage is applied, a second terminal connected to a first node, and a first gate terminal connected to a first scan line to which a first scan signal is applied, a first transistor including a third terminal connected to a first power line to which a first power signal is applied, a fourth terminal connected to a second node, and a second gate terminal connected to the first node, a third transistor including a fifth terminal connected to a sensing line to which an initialization voltage is applied, a sixth terminal connected to the second node, and a third gate terminal connected to a second scan line to which a second scan signal is applied, a storage capacitor including a first electrode connected to the first node and a second electrode connected to the second node, and an organic light emitting diode including an anode electrode connected to the second node and a cathode electrode connected to a second power line to which a second power signal of a level lower than a level of the first power signal is applied. The method includes sensing a first sensing current flowing through the sensing line, which sequentially includes a reset period in which the second transistor is turned on in response to a logic of the first scan line and the data voltage is written to the storage capacitor, a light emitting period in which the third transistor is turned on in response to a logic of the second scan line and an initialization voltage is applied to the second node from the sensing line, and an initialization period in which the second transistor is turned off in response to the logic of the first scan line, switching the second transistor in response to the logic of the first scan line, maintaining a turn-on state of the third transistor in response to the logic of the second scan line, and sensing a sensing voltage of the sensing line, estimating a second sensing current using the sensing voltage, and determining a degradation compensation value by applying following [Equation 1].

$$V_{anode} = V_{ref\_el} - (I_{el}/I_u)^{\frac{1}{2}} \times (V_{ref\_u} - V_{init})$$ [Equation 1]

Here, $V_{anode}$ denotes a voltage of the anode electrode, $V_{ref\_el}$ denotes a reference voltage applied from the data line in the sensing the first sensing current, $I_{el}$ denotes the first sensing current, $I_u$ denotes the second sensing current, $V_{ref\_u}$ denotes a reference voltage applied from the data line in the sensing the sensing voltage, and $V_{init}$ denotes the initialization voltage applied from the sensing line in the sensing the sensing voltage In an exemplary embodiment, the display device may further include a line capacitor connected to the sensing line. The sensing the sensing voltage may include charging the line capacitor to sense the sensing voltage of the sensing line, and the estimating the second sensing current may be performed by applying following [Equation 2].

$$I_u \times t = C_{line} \times V_{line}$$ [Equation 2]

Here, t denotes a time when a current is applied to the sensing line, $C_{line}$ denotes a capacitance of the line capacitor, and $V_{line}$ denotes the sensing voltage.

According to the exemplary embodiments of the invention, the degradation of the pixel may be compensated by estimating the voltage of the anode electrode of the organic light emitting diode, and image quality of the display device may be improved.

The effects according to the exemplary embodiments are not limited by the contents illustrated above, and more various effects are included in the specification.

BRIEF DESCRIPTION OF THE DRAWINGS

The above and other features of the invention will become more apparent by describing in further detail exemplary embodiments thereof with reference to the accompanying drawings, in which.

DETAILED DESCRIPTION

Figure 1:
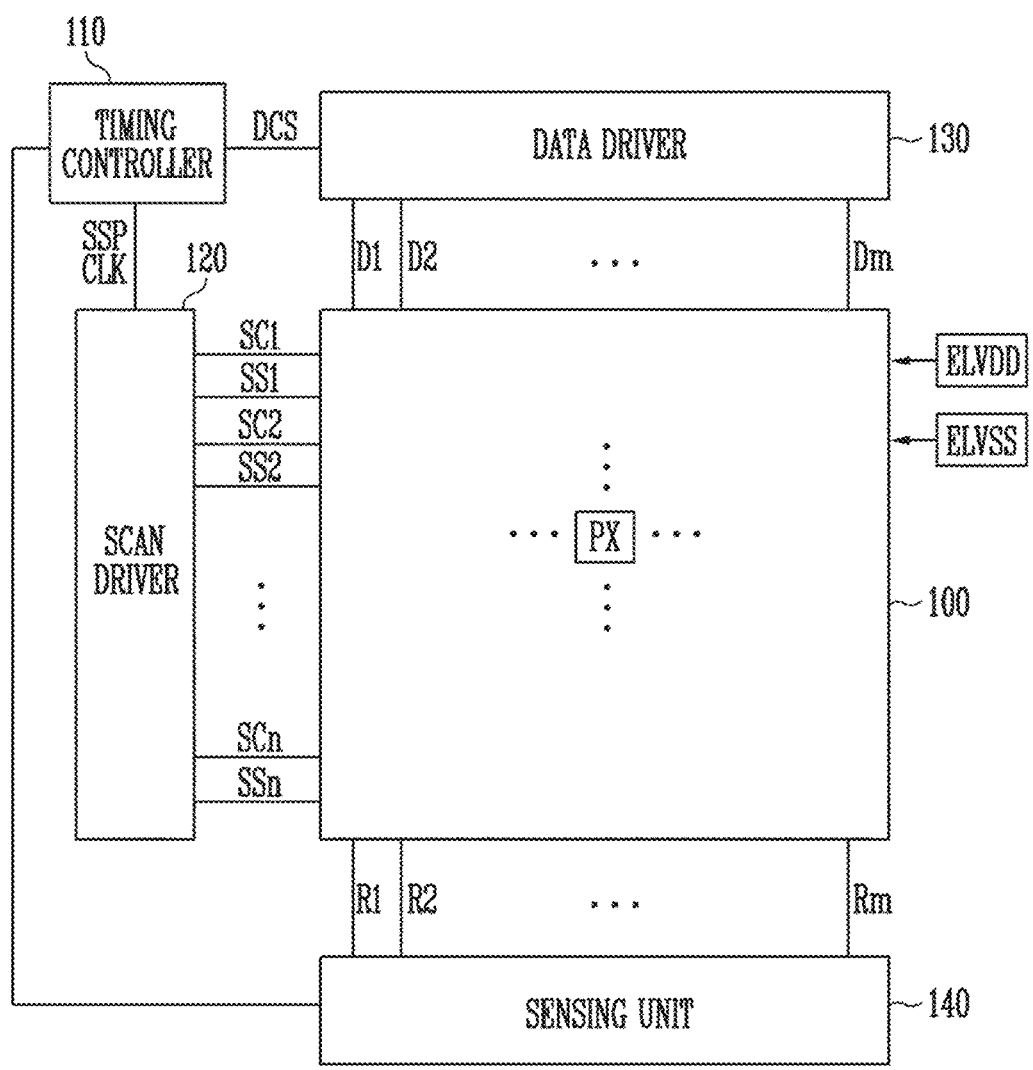
FIG. 1 is a block diagram illustrating an exemplary embodiment of a display device according to the invention.

The advantages and features of the invention and a method of achieving them will become apparent with reference to the exemplary embodiments described in detail below together with the accompanying drawings. However, the invention is not limited to the exemplary embodiments disclosed below, and may be implemented in various different forms. The illustrated exemplary embodiments are provided so that the invention will be thorough and complete and those skilled in the art to which the invention pertains may fully understand the scope of the invention. The invention is only defined by the scope of the claims.

It will be understood that when an element is referred to as being "on" another element, it can be directly on the other element or intervening elements may be present therebetween. In contrast, when an element is referred to as being "directly on" another element, there are no intervening elements present.

Although a first, a second, and the like are used to describe various components, it goes without saying that these components are not limited by these terms. These terms are used only to distinguish one component from another component. Therefore, it goes without saying that a first component mentioned below may be a second component within the technical spirit of the invention. The singular expressions include plural expressions unless the context clearly dictates otherwise.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described a "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

A display device according to the invention may be implemented in a form of various smart apparatus including a smart phone, a notebook, a monitor, a TV, a mobile phone, an MP3 player, a medical measurement apparatus, a wearable device, and an HMD.

Hereinafter, the exemplary embodiment of the invention will be described with reference to the accompanying drawings. The same or similar reference numerals are used for the same components in the drawings.

Figure 2:
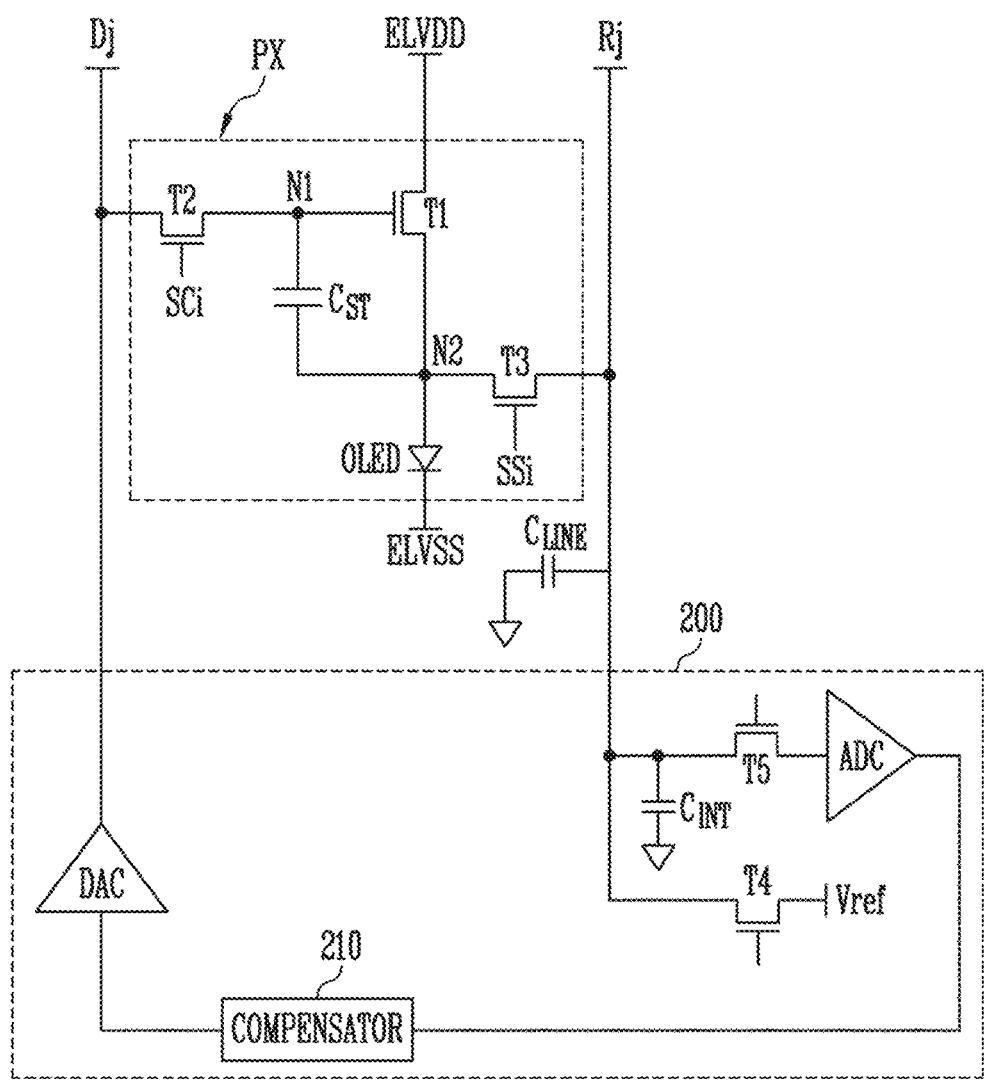
FIG. 2 is a circuit diagram illustrating a relationship between one pixel of FIG. 1 and an external component of the pixel.
Figure 3:
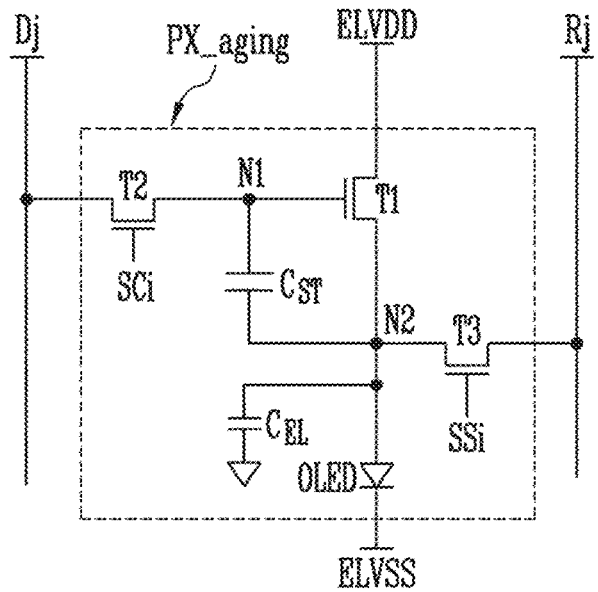
FIG. 3 is an equivalent circuit diagram illustrating the one pixel of FIG. 1 after the one pixel is degraded.

FIG. 1 is a block diagram illustrating an exemplary embodiment of a display device according to the invention. FIG. 2 is a circuit diagram illustrating a relationship between one pixel of FIG. 1 and an external component of the pixel. FIG. 3 is an equivalent circuit diagram illustrating the one pixel of FIG. 1 after the one pixel is degraded.

Referring to FIGS. 1 and 2, the display device may include a display unit 100 including a plurality of pixels PX, a scan driver 120, a data driver 130, a sensing unit 140, and a timing controller 110.

The display device may include a display surface on which a light emitting element emits light, and may display an image through the display surface. In an exemplary embodiment, the display device may be an organic light emitting display device. However, the invention is not limited thereto, and unless the spirit of the invention is changed, the invention may be applied to a display device using an organic light emitting diode ("OLED") as a light emitting device, such as a quantum-dot OLED device, or a display device including the OLED in a back plane such as a liquid crystal display device.

The timing controller 110 may control an operation of the display device by providing predetermined control signals to the data driver 130, the scan driver 120, and the sensing unit 140. The timing controller 110 may generate a scan driving control signal and a data driving control signal DCS based on signals input from the outside. The scan driving control signal generated by the timing controller 110 may be supplied to the scan driver 120, and the data driving control signal DCS may be supplied to the data driver 130.

The scan driving control signal may include a plurality of clock signals CLK and a scan start signal SSP. The scan start signal SSP may control an output timing of a first scan signal.

The data driving control signal DCS may include a source start pulse and clock signals. The source start pulse may control a sampling start time of data, and the clock signals may be used to control a sampling operation.

The scan driver 120 may output scan signals to scan lines SC1 to SCn and SS1 to SSn in response to the scan driving control signal where n is a natural number greater than one. The scan driver 120 may sequentially supply the scan signals to the scan lines SC1 to SCn and SS1 to SSn. Here, the scan signal may be set to a scan-on voltage (for example, a voltage of a high level) so that a transistor included in the pixels PX may be turned on.

The scan driver 120 includes a shift register that individually drives the scan lines SC1 to SCn and SS1 to SSn connected to the display unit 100 in a sequential method or an interlacing method in response to the scan driving control signal from the timing controller 110. The scan driver 120 supplies a scan pulse of the scan-on voltage in a driving period of the scan lines SC1 to SCn and SS1 to SSn to enable a corresponding scan line and supplies a scan off voltage in the remaining periods to disable a corresponding scan line. In an exemplary embodiment, the scan driver 120 is disposed in one outer-side region, but the invention is not limited thereto and the scan driver 120 may be disposed in at least two outer-side regions of the display unit 100.

The data driver 130 may output data signals to data lines D1 to Dm in response to the data driving control signal DCS where m is a natural number greater than one. The data driver 130 may output the data signal by converting digital data of an input image received every frame period into compensation data using a digital-to-analog converter ("DAC").

The data signal supplied to the data lines D1 to Dm may be supplied to the pixels PX to which the scan signal is supplied. To this end, the data driver 130 may supply the data signal to the data lines D1 to Dm in synchronization with the scan signal.

The sensing unit 140 may supply an initialization voltage Vref to the pixels through sensing lines R1 to Rm, and may measure degradation information of the pixels through a sensing current output to the sensing lines R1 to Rm in response to the initialization voltage Vref. In FIG. 1, the sensing unit 140 is shown as a separate configuration, but in another exemplary embodiment, the sensing unit 140 may be included in the data driver 130.

In an exemplary embodiment, the plurality of pixels PX may be disposed in a matrix shape of a row direction and a column direction. In the specification, the row direction indicates a horizontal direction on the drawing, and the column direction indicates a vertical direction on the drawing as a direction crossing the row direction, but are not limited thereto. In an exemplary embodiment, the row direction and the column direction may be understood as relative directions crossing each other.

A row of pixels PX of the plurality of pixels PX arranged in the row direction may be connected to the same first scan line SC1 to SCn and second scan line SS1 to SSn. In addition, a column of pixels PX of the plurality of pixels PX arranged in the column direction may be connected to the same data lines D1 to Dm. That is, one pixel PX may be connected to one data line Dj among the data lines DL1 to DLm, one first scan line SCi among first scan lines SL1 to SLn, one second scan line SSi among second scan lines SS1 to SSn, and one sensing line Rj among the sensing lines R1 to Rm, where i and j are natural numbers.

Each pixel PX is independently driven by a plurality of transistors T1, T2, and T3. As the transistors T1, T2, and T3, an amorphous silicon (a-Si) transistor, a poly-silicon (poly-Si) transistor, an oxide transistor, an organic transistor, or the like may be used. In an exemplary embodiment, the pixel PX may include a first transistor T1, a second transistor T2, a third transistor T3, a storage capacitor $C_{ST}$, and an OLED. In an exemplary embodiment, the first transistor T1, the second transistor T2, and the third transistor T3 may be a driving transistor, a switching transistor, and a sensing transistor, respectively.

The pixel PX may receive a first power signal ELVDD of high potential through a first power line from the outside and may receive a second power signal ELVSS of a low potential through a second power line from the outside.

The second transistor T2 may include a first terminal connected to the data line Dj, a second terminal connected to a first node N1, and a gate terminal connected to the first scan line SCi. Here, the first node N1 may be a node provided by a second terminal of the second transistor T2, a gate terminal of the first transistor T1, and a first electrode of the storage capacitor $C_{ST}$.

The second transistor T2 may transmit the data signal provided from the data driver 130 to the storage capacitor $C_{ST}$ and the gate terminal of the first transistor T1 in response to the scan signal applied from the scan driver 120.

The storage capacitor $C_{ST}$ may include the first electrode connected to the first node N1, and a second electrode connected to a second node N2. Here, the second node N2 may be a node to which a second electrode of the storage capacitor $C_{ST}$, a second terminal of the first transistor T1, a second terminal of the third transistor T3, and an anode electrode of the OLED are electrically connected.

The storage capacitor $C_{ST}$ may store the data signal transmitted through the second transistor T2. The storage capacitor $C_{ST}$ may store a voltage signal equal to or greater than a threshold voltage of the first transistor T1 between the first electrode and the second electrode for a predetermined time.

The first transistor T1 may include a first terminal connected to the first power line to which the first power signal ELVDD is transmitted, the second terminal connected to the second node N2, and the gate terminal connected to the first node N1. The first transistor T1 may be turned on or off according to the data signal stored in the storage capacitor $C_{ST}$. In an exemplary embodiment, when a data signal of a level greater than the threshold voltage of the first transistor T1 is applied to the gate terminal, the first transistor T1 may be turned on and a driving current may flow from the first terminal to the second terminal of the first transistor T1, for example.

The OLED may include the anode electrode connected to the second node N2 and a cathode electrode connected to the second power line. The OLED may emit light based on the driving current flowing from the first power line to the second power line while the first transistor T1 is turned on. The OLED may include a light emitting element layer between the anode electrode and the cathode electrode, and may emit light in proportion to a current amount of the driving current.

The third transistor T3 may include a first terminal connected to the sensing line Rj, the second terminal connected to the second node N2, and a gate terminal connected to the second scan line SSi. The third transistor T3 operates to supply the initialization voltage Vref transferred to the first terminal through the sensing line Rj to the second node N2 to which the second terminal of the first transistor T1 is connected or to sense a voltage or a current of the second node N2 to which the second terminal of the transistor T1 is connected.

The third transistor T3 may be turned on according to a logic state of the second scan line SSi to supply the initialization voltage Vref to the second node N2. When the initialization voltage Vref is supplied to the second node N2, the data voltage written to the anode electrode of the OLED may be initialized.

An operation time of the third transistor T3 may be similar to/same as or different from that of the second transistor T2 according to an external compensation algorithm (not shown). In an exemplary embodiment, the gate terminal of the second transistor T2 may be connected to the first scan line SCi, and the gate terminal of third transistor T3 may be connected to the second scan line SSi. In this case, a scan signal is transferred to the first scan line SCi and a sensing signal is transferred to the second scan line SSi. In another exemplary embodiment, the first scan line SCi connected to the gate terminal of the second transistor T2 and the second scan line SSi connected to the gate terminal of the third transistor T3 may be commonly connected so as to be shared.

The initialization voltage Vref may be provided from the sensing unit 140 through the sensing line Rj. In this case, the sensing unit 140 may sense the second node N2 of the pixel PX in real time, a non-display period of the image, or at least one frame period, and may generate a sensing result. In an exemplary embodiment, the initialization voltage Vref may be about 2 volts (V), for example.

A threshold voltage and current mobility of the first transistor T1 may be sensed through the third transistor T3 and the sensing line Rj, and a threshold voltage compensation data Vth for compensating for a data voltage to the anode electrode in proportion to a difference between a sensing value and the threshold voltage may be generated.

In an exemplary embodiment, the data driver 130, the sensing unit 140, the scan driver 120, and the timing controller 110 may be implemented as one integrated circuit ("IC"). In another exemplary embodiment, the data driver 130, the scan driver 120, and the timing controller 110 may be implemented as two or more ICs.

A structure of the pixel PX including the three transistors T1, T2, and T3, and one capacitor $C_{ST}$ according to the illustrated exemplary embodiment may be more suitable for enlargement of the display device, but is not limited thereto. The exemplary embodiment is not limited to the number of transistors and the number of capacitors forming the pixel PX. In another exemplary embodiment, the pixel PX may include seven transistors and one capacitor, and in this case the pixel may be more suitable for miniaturization of the display device.

The display device may include an analog-to-digital converter ("ADC") connected to one end of the sensing line Rj, a sensing switch circuit, and the like. The sensing switch circuit may include first and second switching elements T4 and T5. In the illustrated exemplary embodiment, the first and second switching elements T4 and T5 are illustrated as being provided in a form of thin film transistors ("TFTs"), respectively. The display device may further include a line capacitor $C_{LINE}$ connected to the sensing line Rj and performing a charging operation to sense a current of the first transistor D1.

In an exemplary embodiment, the sensing line Rj may sense a voltage (a voltage of the second node N2) of the second terminal (for example, a source electrode) of the first transistor T1 to sense an electrical characteristic of the first transistor T1.

The first switching element T4 may supply a predetermined initialization voltage Vref to the sensing line Rj to initialize the voltage (the voltage of the second node N2) of the second terminal of the first transistor T1 into the initialization voltage Vref.

The second switching device T5 may be turned on after the first switching device T4 is turned off to supply the voltage (the voltage of the second node N2) of the second terminal of the first transistor T1 to the ADC. The ADC converts an analog sensing voltage into digital sensing data and transmits the digital sensing data to a compensator 210. The voltage (the voltage of the second node N2) of the second terminal of the first transistor T1 may indicate a threshold voltage or mobility of the first transistor T1 according to a sensing method. A method of sensing the threshold voltage of the first transistor T1 through the sensing line Rj or a method of sensing the mobility of the first transistor T1 through the sensing line Rj may use a known sensing method. The ADC, the compensator 210, and the DAC may be included in an application processor ("AP") 200 or a driver chip (driver IC) 200, disposed as a separate component, or integrated with the data driver 130. In an exemplary embodiment, an initialization capacitor $C_{INT}$ including a first electrode connected to the second switching device T5 and the sensing line Rj and a second electrode connected to ground may be further included in the AP 200 or the driver chip (driver IC) 200.

In a normal pixel PX, the threshold voltage and an electron mobility characteristic of the first transistor T1 are reflected in the driving current. Referring to FIG. 3, in a case of a pixel PX_aging of which degradation occurs, a current value by the first transistor T1 is changed due to a characteristic change of the OLED, and thus degradation compensation data may be desired. FIG. 3 shows an equivalent circuit in which the pixel PX_aging of which the degradation occurs has a degradation capacitance $C_{EL}$ due to the characteristic change of the OLED.

In an exemplary embodiment, the degradation compensation data may be determined according to a ratio of a voltage value of the anode electrode of the OLED connected to the first transistor T1 after the degradation to a voltage value of the anode electrode before degradation. However, in some cases, the voltage value of the anode electrode may not be directly measured for each pixel. In this case, the voltage value of the anode electrode may be estimated through the following method and the degradation compensation data may be generated through the estimated voltage value.

Figure 4:
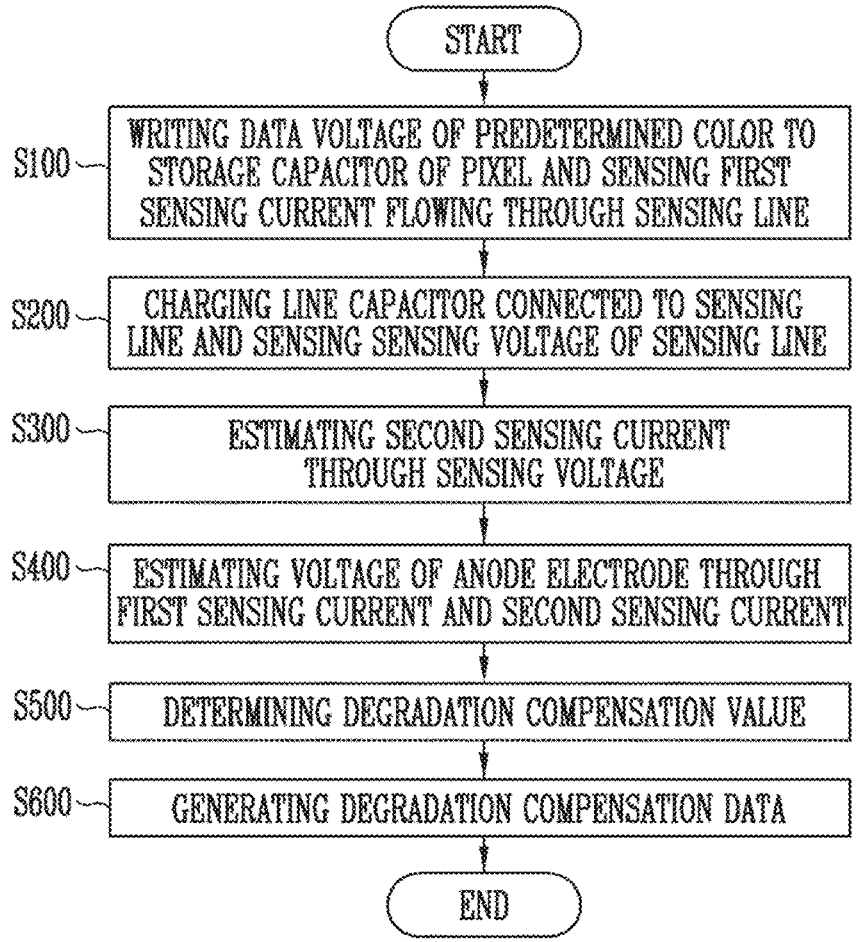
FIG. 4 is a flowchart illustrating an exemplary embodiment of a method of compensating for degradation of a display device.

FIG. 4 is a flowchart illustrating an exemplary embodiment of a method of compensating for degradation of a display device.

Referring to FIG. 4, the method of compensating for the degradation of the display device may include writing a data voltage of a predetermined color to a storage capacitor of a pixel and sensing a first sensing current flowing through a sensing line (S100), charging a line capacitor connected to the sensing line and sensing a sensing voltage of the sensing line (S200), estimating a second sensing current through the sensing voltage (S300), estimating a voltage of an anode electrode through the first sensing current and the second sensing current (S400), determining a degradation compensation value (S500), and generating the degradation compensation data (S600).

In the specification, each operation is described as being performed in turn according to a flowchart, but unless the spirit of the invention is changed, some operations shown to be performed successively may be performed simultaneously, the order of each operation may be changed, some operations may be omitted, or another operation may be further included between each operation.

First, sensing the first sensing current (S100) will be described with reference to FIGS. 5 to 9 together.

Figure 5:
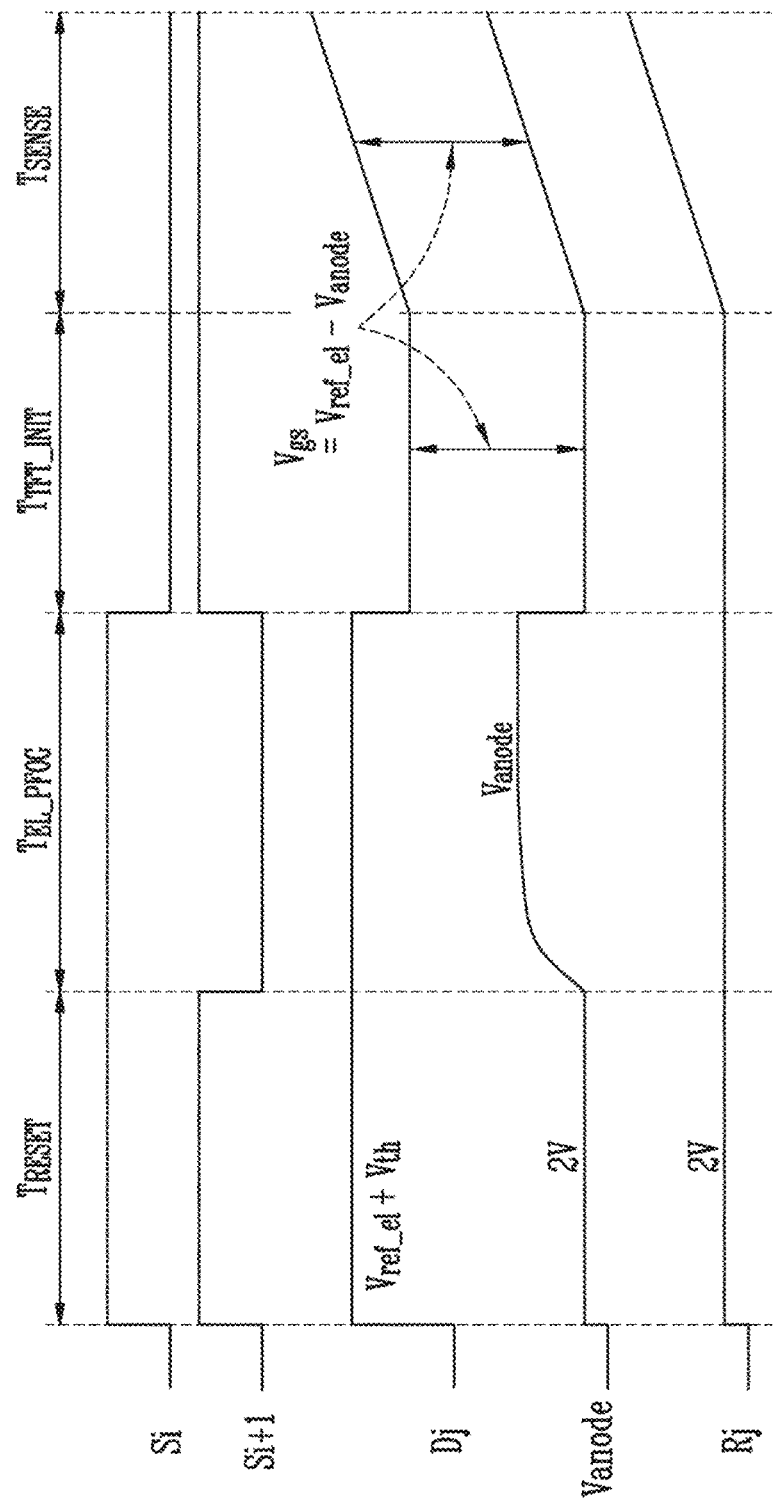
FIG. 5 is a timing diagram illustrating a process of sensing a first sensing current.

FIG. 5 is a timing diagram illustrating a process of sensing the first sensing current. FIGS. 6 to 9 are circuit diagrams illustrating a flow of a current in a pixel of each period of FIG. 5. FIGS. 5 to 9 show that the operation may be applied equally before and after degradation of the pixel by indicating a degradation capacitance with a dotted line.

Referring to FIG. 5, sensing the first sensing current (S100) may include a reset period $T_{RESET}$, a light emitting period $T_{EL\_PFOG}$, an initialization period $T_{TFT\_INIT}$, and a sensing period $T_{SENSE}$.

When the OLED emits a predetermined color, a current flowing through the OLED may be used to estimate the voltage (a potential of the second node N2) of the anode electrode.

In an exemplary embodiment, the current flowing through the OLED for the predetermined color may be sensed by programming the storage capacitor $C_{ST}$. In general, the initialization voltage Vref provided to the second node N2 through the sensing line Rj includes all of red, green, and blue signal elements. Therefore, in order to sense the current flowing through the OLED for the predetermined color, the storage capacitor $C_{ST}$ may be programmed. In an exemplary embodiment, the predetermined color may be a gray color, for example. Hereinafter, operations and sections are performed through the sensing for the gray color as an example, but a type of the predetermined color is not limited thereto.

First, the following [Equation 3] may be applied to a relationship between the current flowing through the OLED and the voltage of the anode electrode.

$$I_{el} = u \times (V_{ref\_el} - V_{anode})^2 \quad \text{[Equation 3]}$$

Here, $I_{el}$ corresponds the current flowing through the OLED (first sensing current), u corresponds a current mobility factor, $V_{ref\_el}$ corresponds a reference voltage, and $V_{anode}$ corresponds a voltage value of the anode electrode.

In an exemplary embodiment, the reset period $T_{RESET}$ may be a programming period for writing a data voltage of the predetermined color to the storage capacitor.

Figure 6:
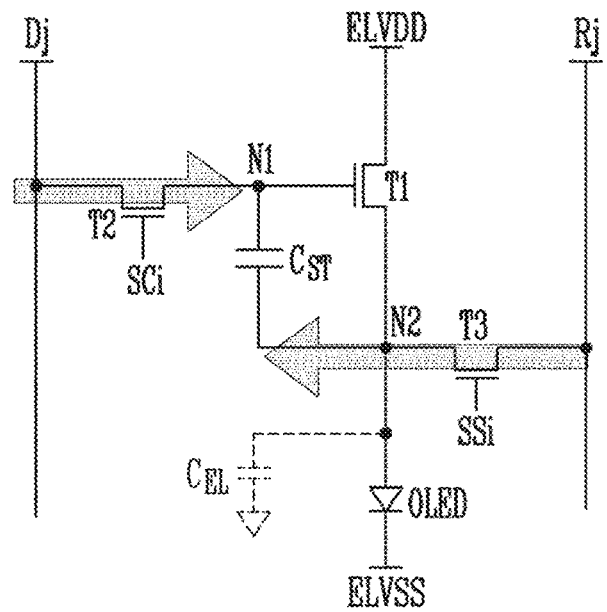
FIGS. 6 to 9 are circuit diagrams illustrating a flow of a current in a pixel of each period of FIG. 5.

Referring to FIGS. 5 and 6, in the reset period $T_{RESET}$, the second transistor T2 may be turned on in response to a high logic state of the first scan line SCi, i.e., a state in which a first scan signal Si having a high level is applied to the first scan line SCi, to apply the data signal to the first node N1. In an exemplary embodiment, a voltage level of the data signal may be a voltage level corresponding to a sum of the reference voltage $V_{ref\_el}$ and the threshold voltage compensation data Vth of the first transistor T1 for each pixel, for example. The reference voltage $V_{ref\_el}$ and the threshold voltage compensation data Vth may be determined in advance through driving of the display device, and thus the voltage level of the data signal may be determined.

The third transistor T3 may be turned on in response to a high logic state of the second scan line SSi, i.e., a state in which a second scan signal Si+1 having a high level is applied to the second scan line SSi, to apply the initialization voltage Vref to the second node N2. The sensing line and the anode electrode may have the same potential as the second node N2. The second node N2 may be initialized to have the same voltage level as that of the initialization voltage Vref. In an exemplary embodiment, the initialization voltage Vref may be about 2 V, for example.

A voltage corresponding to a potential difference between the first node N1 and the second node N2 may be written to the storage capacitor $C_{ST}$. That is, a voltage equal to an absolute value obtained by subtracting a value of the initialization voltage Vref from a value obtained by adding a value of the reference voltage Vref_el and the threshold voltage compensation data Vth of the first transistor T1 for each pixel may be written to the storage capacitor $C_{ST}$.

Here, the potential difference between the first node N1 and the second node N2 may be a gate-source voltage of the first transistor T1.

In an exemplary embodiment, the light emitting period $T_{EL\_PFOG}$ may be a period during which the OLED emits light.

Figure 7:
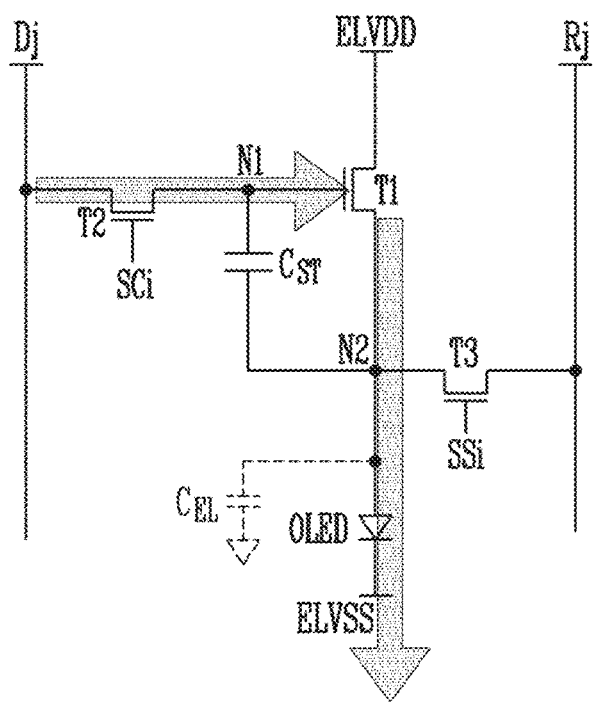

Referring to FIGS. 5 and 7, in the light emitting period $T_{EL\_PFOG}$, the second transistor T2 may maintain a turn-on state in response to a high logic state of the first scan line SCi, and the third transistor T3 may be turned off in response to a low logic state of the second scan line SSi. The first power signal ELVDD may be applied to the second node N2 through the first transistor T1. The first power signal ELVDD may gradually increase, and when the first power signal ELVDD reaches a predetermined voltage, the OLED may emit light.

The current flowing through the OLED may be gradually increased, and may form a balance state with the current flowing through the first transistor T1. The potential of the anode electrode in the balance state may be Vanode, which is the voltage of the anode electrode described above. However, a value of Vanode of the OLED of each pixel PX may be changed according to a degradation state.

Figure 8:
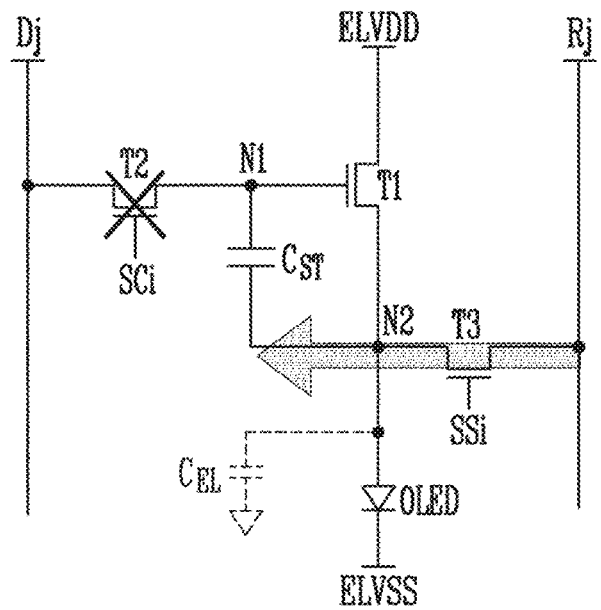

Referring to FIGS. 5 and 8, in the initialization period $T_{TFT\_INIT}$, the second transistor T2 may be turned off in response to a low logic state of the first scan line SCi, and the third transistor T3 may be turned on in response to a high logic state of the second scan line SSi.

The initialization voltage Vref may be applied to the second node N2 to which the anode electrode is connected, through the sensing line Rj. A potential of the second node N2 may have a potential of the same voltage level as that of the initialization voltage Vref again.

In the reset period $T_{RESET}$, since the data voltage reflecting the threshold voltage compensation data Vth is written to the storage capacitor $C_{ST}$, in the initialization period $T_{TFT\_INIT}$, the threshold voltage compensation data Vth may be offset in the voltage of the storage capacitor $C_{ST}$ and the voltage of the storage capacitor $C_{ST}$ may have a voltage equal to a difference between the reference voltage Vref_el and the voltage of the anode electrode.

That is, the following [Equation 4] may be applied to the gate-source voltage of the first transistor T1.

$$V_{gs} = V_{ref\_el} - V_{anode} \quad \text{[Equation 4]}$$

Here, $V_{gs}$ corresponds to the gate-source voltage of the first transistor T1.

Figure 9:
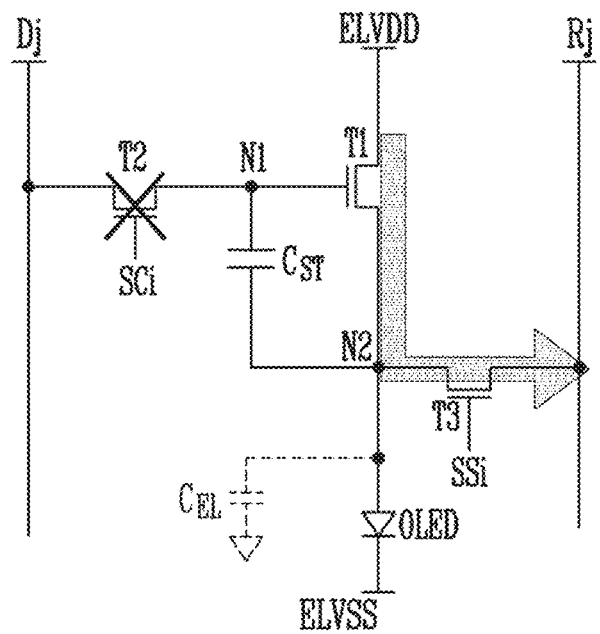

Referring to FIGS. 5 and 9, in the sensing period $T_{SENSE}$, the second transistor T2 may maintain a turn-off state in response to a low logic state of the first scan line SCi, and the third transistor T3 may maintain a turn-on state in response to a high logic state of the second scan line SSi. Even in the sensing period $T_{SENSE}$, [Equation 2] above may be applied to the gate-source voltage of the first transistor T1.

Even when the second transistor T2 is turned off by the voltage charged by the storage capacitor $C_{ST}$, the first transistor T1 may be turned on and a current may flow through the first transistor T1. Since a resistance of the OLED is relatively greater than that of the sensing line Rj, most of the current does not flow to the OLED, but may flow through the sensing line Rj as a first sensing current. That is, the first sensing current may have a value substantially similar to that of the driving current when the OLED emits light, and the first sensing current may be sensed through the sensing line Rj in the sensing period $T_{SENSE}$.

Next, charging the line capacitor connected to the sensing line and sensing the sensing voltage of the sensing line (S200), and estimating the second sensing current through the sensing voltage (S300) will be described with reference to FIGS. 10 and 11 together.

Figure 10:
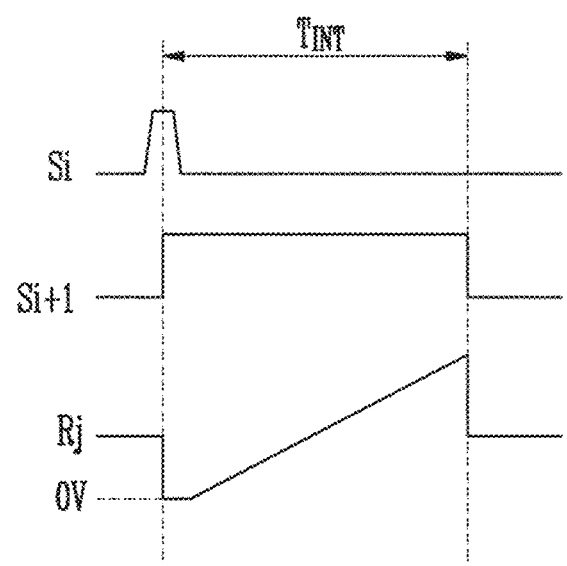
FIG. 10 is a timing diagram illustrating a process of measuring a sensing voltage.
Figure 11:
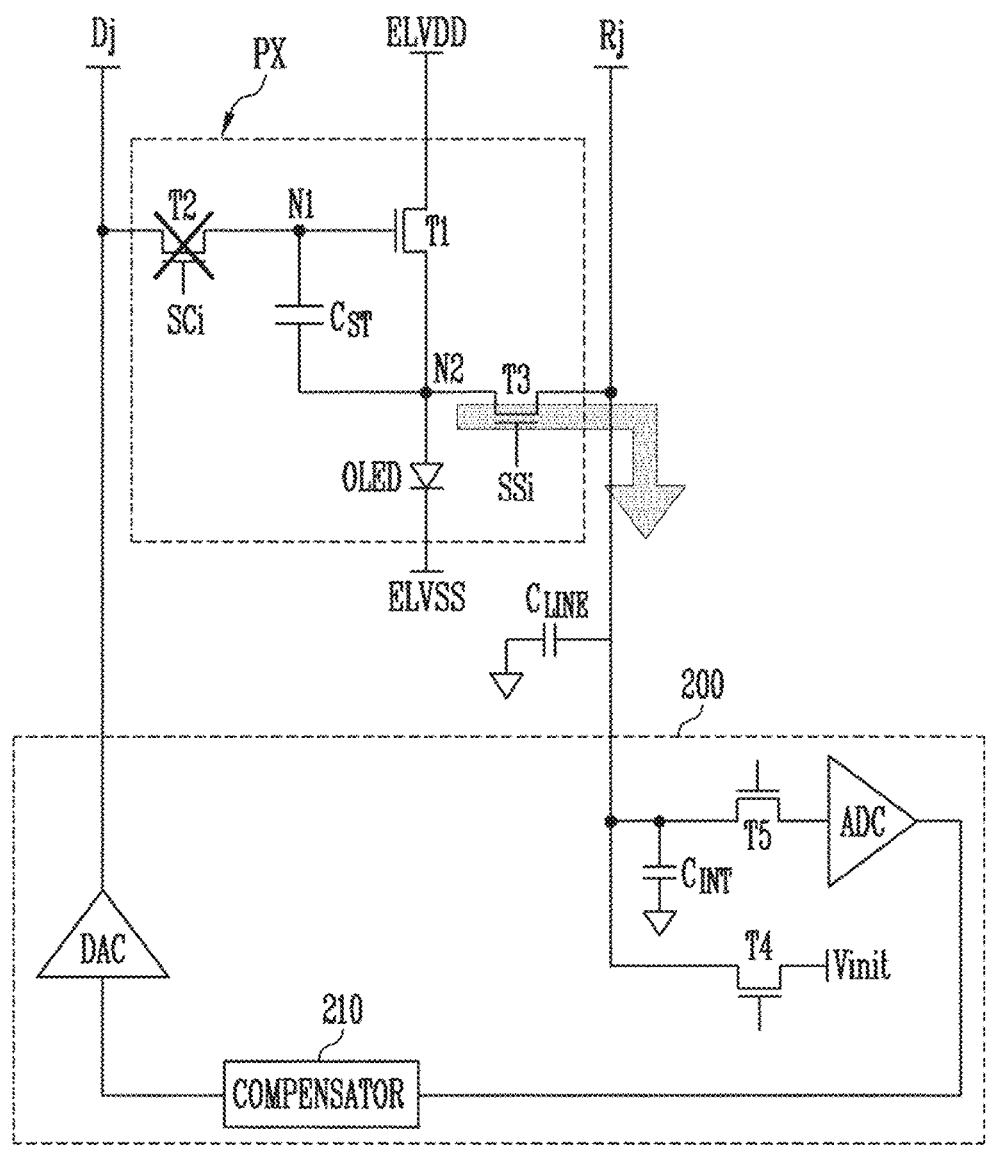
FIG. 11 is a circuit diagram illustrating a flow of a current according to the timing diagram of FIG. 10.

FIG. 10 is a timing diagram illustrating a process of measuring a sensing voltage. FIG. 11 is a circuit diagram illustrating a flow of a current according to the timing diagram of FIG. 10. In FIG. 11, reference numerals of the reference voltage and the initialization voltage Vinit and symbols of Equation applied to the operation are different from those of the operations described above so as to distinguish from the operations described above.

In an exemplary embodiment, charging the line capacitor $C_{LINE}$ connected to the sensing line Rj and sensing the sensing voltage of the sensing line Rj (S200), and estimating the second sensing current based on the sensing voltage (S300) may be sensing mobility of the current flowing through the first transistor T1 and the OLED.

In an exemplary embodiment, charging the line capacitor $C_{LINE}$ connected to the sensing line Rj and sensing the sensing voltage of the sensing line Rj (S200) may include a period TINT for charging the line capacitor $C_{LINE}$.

The second transistor T2 may be turned on in response to a pulse response of the first scan line SCi. After the storage capacitor $C_{ST}$ is charged, the second transistor T2 may be turned off, and the third transistor T3 may be turned on in response to a high logic state of the second scan line SSi and may maintain a turn-on state.

When the second transistor T2 is turned on and the third transistor T3 is turned on, the gate-source voltage of the first transistor T1 may be a difference between the reference voltage and the initialization voltage Vinit. In addition, a charge corresponding to the difference between the reference voltage and the initialization voltage Vinit may be charged in the storage capacitor $C_{ST}$.

When the third transistor T3 maintains a turn-on state and the second transistor T2 is turned off, the first transistor T1 may maintain the turn-on state by the voltage charged in the storage capacitor $C_{ST}$, and the driving current may flow along the sensing line Rj and increase. Therefore, the line capacitor $C_{LINE}$ connected to the sensing line Rj may be charged while an applied voltage increases. A voltage of the line capacitor $C_{LINE}$ may be measured.

Based on a charge amount charged in the line capacitor $C_{LINE}$, the second sensing current may be estimated by applying the following [Equation 5]. As described above, the second sensing current may be substantially similar to the current flowing when the OLED emits light.

$$I_u \times t = C_{line} \times V_{line} \qquad \text{[Equation 5]}$$

Here, t corresponds a time when the second sensing current flows, $C_{line}$ corresponds a capacitance of the line capacitor $C_{LINE}$, and $V_{line}$ corresponds the voltage of the line capacitor $C_{LINE}$.

[Equation 6] corresponding to [Equation 3] may be applied to the second sensing current.

$$I_u = u \times (V_{ref\_u} - V_{init})^2 \qquad \text{[Equation 6]}$$

Here, $I_u$ corresponds a current (second sensing current) flowing through the OLED, u corresponds a current mobility factor, $V_{ref\_u}$ corresponds a reference voltage applied through the data line Dj in the operation, and $V_{init}$ corresponds to an initialization voltage value applied through the sensing line Rj.

Next, estimating the voltage of the anode electrode (S400) will be described.

Before degradation, [Equation 7] and [Equation 8] corresponding to [Equation 3] and [Equation 6] may be applied to the first sensing current and the second sensing current, respectively.

$$I_{el1} = u_1 \times (V_{ref\_el} - V_{anode})^2 \qquad \text{[Equation 7]}$$

$$I_{u1} = u_1 \times (V_{ref\_u} - V_{init})^2 \qquad \text{[Equation 8]}$$

A ratio of the first sensing current to the second sensing current may be expressed as [Equation 9] by [Equation 7] and [Equation 8], and the voltage of the anode electrode before degradation may be estimated as [Equation 10] by [Equation 9].

$$\frac{I_{el1}}{I_{u1}} = \frac{u_1 \times (V_{ref\_el} - V_{anode1})^2}{u_1 \times (V_{ref\_u} - V_{init})^2} \qquad \text{[Equation 9]}$$

$$V_{anode1} = V_{ref\_el} - (I_{el1}/I_{u1})^{\frac{1}{2}} \times (V_{ref\_u} - V_{init}) \qquad \text{[Equation 10]}$$

The voltage of the anode electrode before degradation may be estimated through the above-described process.

After degradation, [Equation 11] and [Equation 12] corresponding to [Equation 3] and [Equation 6] may be applied to the first sensing current and the second sensing current, respectively.

$$I_{el2} = u_2 \times (V_{ref\_el} - V_{anode2})^2 \qquad \text{[Equation 11]}$$

$$I_{u2} = u_2 \times (V_{ref\_u} - V_{init})^2 \qquad \text{[Equation 12]}$$

Similarly to the case before the degradation, the voltage of the anode electrode may be estimated after degradation, and [Equation 13] may be applied to the voltage of the anode electrode after degradation.

$$V_{anode2} = V_{ref\_el} - (I_{el2}/I_{u2})^{\frac{1}{2}} \times (V_{ref\_u} - V_{init}) \qquad \text{[Equation 13]}$$

The voltage of the anode electrode after degradation may be estimated through the above-described process.

Next, determining the degradation compensation value (S500) and generating the degradation compensation data (S600) will be described.

Figure 12:
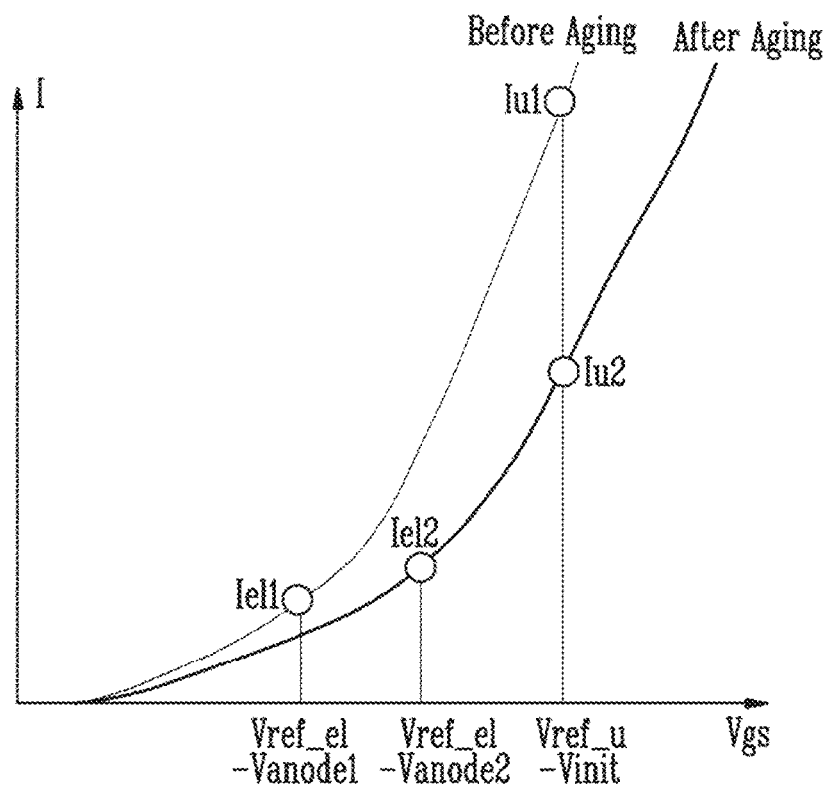
FIG. 12 is a graph illustrating a driving current flowing through an organic light emitting diode versus a gate-source voltage of a driving transistor.
Figure 13:
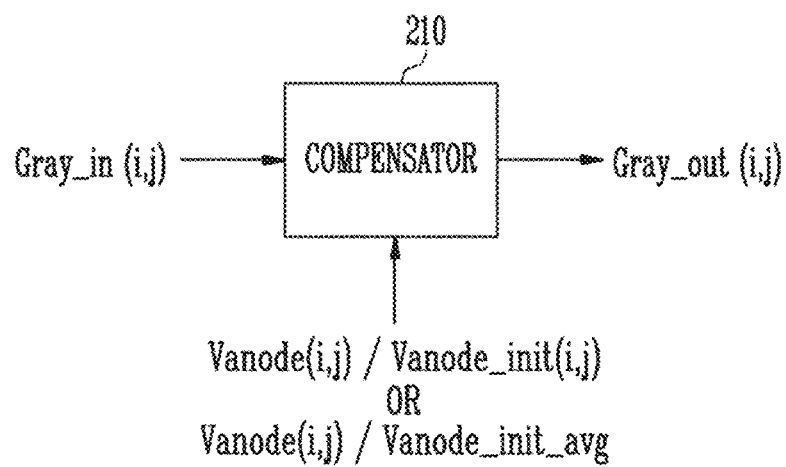
FIG. 13 is a schematic block diagram for schematically describing a method of generating degradation compensation data.
Figure 14:
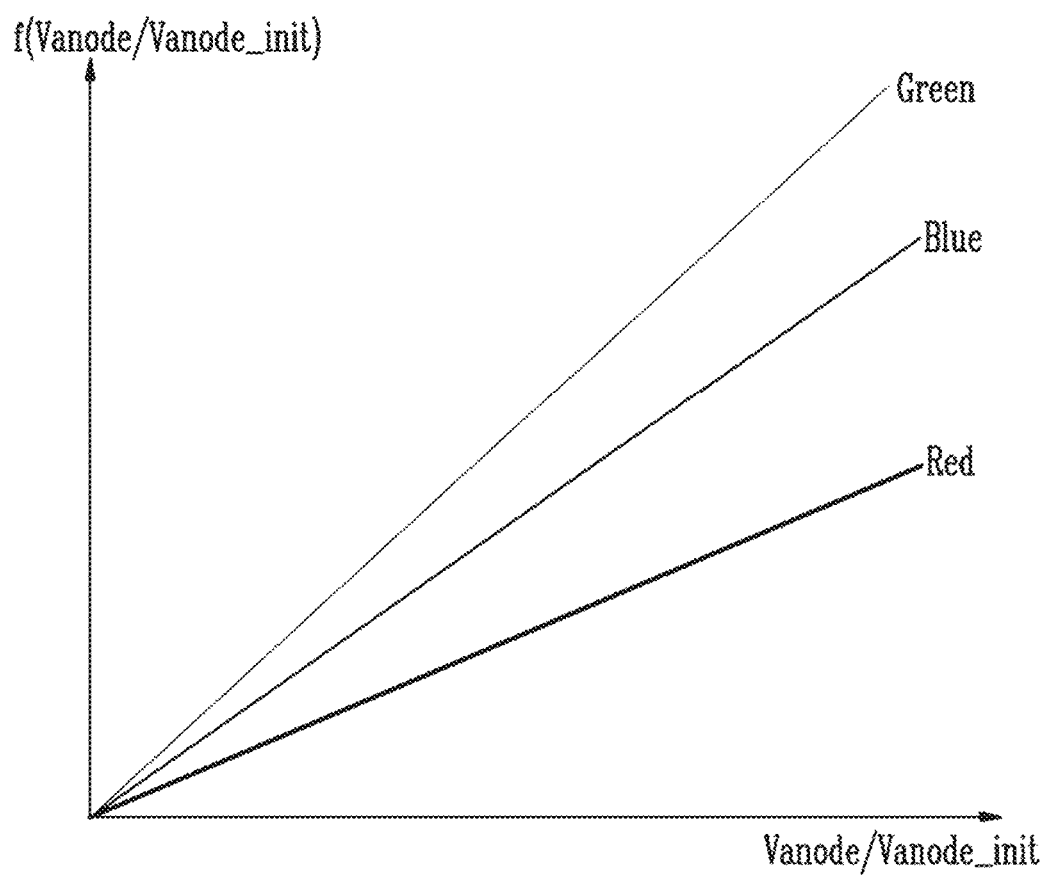
FIGS. 14 and 15 are graphs showing a ratio of the voltage of the anode electrode after degradation to a voltage of an anode electrode before degradation as a function in some exemplary embodiments.
Figure 15:
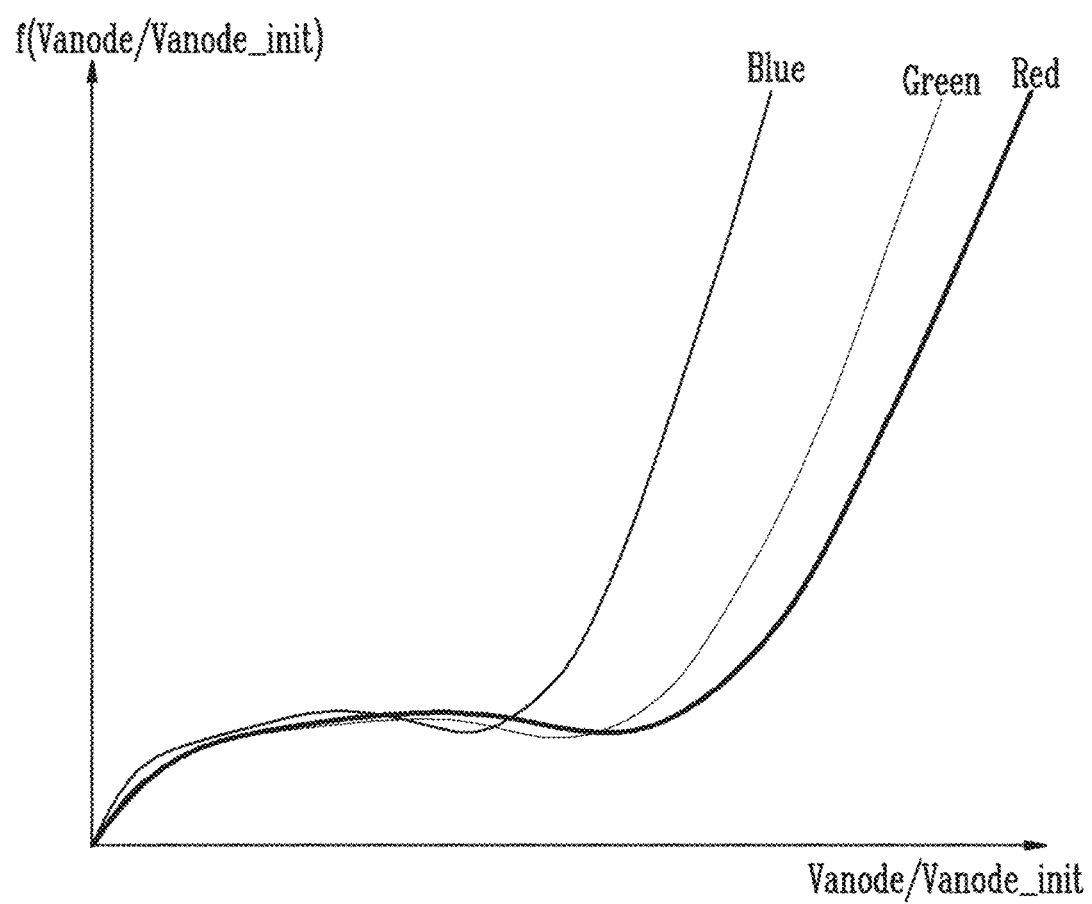

FIG. 12 is a graph illustrating a driving current flowing through an OLED versus a gate-source voltage of a driving transistor. FIG. 13 is a schematic block diagram for schematically describing a method of generating degradation compensation data. FIGS. 14 and 15 are graphs showing a ratio of the voltage of the anode electrode after degradation to the voltage of the anode electrode before degradation as a function in some exemplary embodiments. In the graph of FIG. 12, first sensing currents Iel1 and Iel2 and second sensing currents Iu1 and Iu2 obtained before and after degradation are denoted.

Referring to FIG. 12, a resistance component of the OLED may increase as the voltage of the anode electrode increases. The size of the resistance component may be generally proportional to a degradation amount. Therefore, the degradation compensation value may be determined in proportion to the voltage of the anode electrode.

Referring to FIG. 13, the compensator 210 may receive a data signal Gray_in(i,j) of a predetermined color of a pixel of a predetermined position, a voltage Vanode_init(ij) of the anode electrode before degradation, a voltage Vanode(i,j) of the the anode electrode after degradation, and an average voltage Vanode_init_avg of the anode electrodes before degradation of the pixels. Here, the average voltage Vanode_init_avg of the anode electrode before degradation of all pixels may be estimated by estimating the voltage Vanode_init(ij) of the anode electrode before anode degradation for each pixel through the process of FIGS. 5 to 11 and calculating the average value of the voltage Vanode_init(ij) of the anode electrode before degradation of all pixels.

The compensator 210 may determine the degradation compensation value using the data signal Gray_in(i,j) of the predetermined color of the pixel of the predetermined position, and a ratio Vanode(i,j)/Vanode_init(i,j) of the voltage Vanode(i,j) of the anode electrode in the pixel of the predetermined position after degradation to the voltage Vanode_init(i,j) of the anode electrode in the pixel of the predetermined position before degradation, may generate compensation data using the ratio, and may output data signal Gray_out(i,j) to which the compensation data is applied.

In an alternative exemplary embodiment, the compensator 210 may determine the degradation compensation value using the data signal Gray_in(i,j) of the predetermined color of the pixel of the predetermined position, and a ratio Vanode(i,j)/Vanode_init_avg of the voltage Vanode(i,j) of the anode electrode in the pixel of the predetermined position after degradation to the average voltage Vanode_init_avg of the anode electrode before degradation of all pixels, may generate compensation data using the ratio, and may output data signal Gray_out(ij) to which the compensation data is applied. The compensation data may be generated by reflecting at least one panel characteristic among a material characteristic, a deterioration characteristic, and a luminance characteristic to a value of the ratio Vanode(i,j)/Vanode_init_avg of the voltage Vanode(i,j) of the anode electrode in the pixel of the predetermined position after degradation to the average voltage Vanode_init_avg of the anode electrode before degradation of all pixels, and performing a function operation. In addition to the gray color, compensation data of red, green, and blue colors may be generated.

A function for generating the compensation data of the red, green, and blue colors may be denoted as a linear function as shown in FIG. 14 or a non-linear function as shown in FIG. 15.

The degradation of the display device may be compensated through the processes described above.

The order of sensing the flowing first sensing current (S100), charging the line capacitor connected to the sensing line and sensing the sensing voltage of the sensing line (S200), and estimating the second sensing current through the sensing voltage (S300) may be variously changed.

Although the exemplary embodiments of the invention have been described with reference to the accompanying drawings, it will be understood by those skilled in the art to which the invention pertains that the exemplary embodiments may be implemented in other specific forms without changing the technical spirit and essential features of the invention. Therefore, it should be understood that the exemplary embodiments described above are illustrative and are not restrictive in all exemplary embodiments.

What is claimed is:

1. A method of compensating for degradation of a display device, the display device comprising a pixel comprising: a second transistor including a first terminal connected to a data line to which a data voltage is applied, a second terminal connected to a first node, and a first gate terminal connected to a first scan line to which a first scan signal is applied; a first transistor including a third terminal connected to a first power line to which a first power signal is applied, a fourth terminal connected to a second node, and a second gate terminal connected to the first node; a third transistor including a fifth terminal connected to a sensing line to which an initialization voltage is applied, a sixth terminal connected to the second node, and a third gate terminal connected to a second scan line to which a second scan signal is applied; a storage capacitor including a first electrode connected to the first node and a second electrode connected to the second node; and an organic light emitting diode including an anode electrode connected to the second node and a cathode electrode connected to a second power line to which a second power signal of a level lower than a level of the first power signal is applied, the method comprising:

sensing a first sensing current flowing through the sensing line, which sequentially includes a reset period, a light emitting period, and an initialization period, in the reset period, the second transistor is turned on in response to a logic of the first scan line and the data voltage is written to the storage capacitor, in the light emitting period, the third transistor is turned off in response to a logic of the second scan line, and in the initialization period, the second transistor is turned off in response to the logic of the first scan line and the third transistor is turned on in response to the logic of the second scan line such that the initialization voltage is applied to the second node from the sensing line;

switching the second transistor in response to the logic of the first scan line;

maintaining a turn-on state of the third transistor in response to the logic of the second scan line;

sensing a sensing voltage of the sensing line;

estimating a second sensing current using the sensing voltage; and determining a degradation compensation value by applying following $$V_{anode} = V_{ref\_el} - (I_{el1}/I_u)^{\frac{1}{2}} \times (V_{ref\_u} - V_{init})$$ [Equation 1]

wherein, $V_{anode}$ denotes a voltage of the anode electrode, $V_{ref\_el}$ denotes a reference voltage associated with the data voltage applied from the data line in the sensing of the first sensing current, $L_{el}$ denotes the first sensing current, $I_u$ denotes the second sensing current, $V_{ref\_u}$ denotes a reference voltage associated with the data voltage applied from the data line in the sensing of the sensing voltage, and $V_{init}$ denotes the initialization voltage applied from the sensing line in the sensing of the sensing voltage.

2. The method according to claim 1, wherein the display device further comprises a line capacitor connected to the sensing line, the sensing of the sensing voltage includes charging the line capacitor to sense the sensing voltage of the sensing line, and the estimating the second sensing current is performed by applying following [Equation 2]

$$I_u \times t = C_{line} \times V_{line}$$ [Equation 2]

wherein, t denotes a time when a current is applied to the sensing line, $C_{line}$ denotes a capacitance of the line capacitor, and $V_{line}$ denotes the sensing voltage.

* * * * *